United States Patent
Jo et al.

(10) Patent No.: US 10,937,855 B2
(45) Date of Patent: Mar. 2, 2021

(54) DISPLAY APPARATUS AND FAN-OUT PORTION

(71) Applicant: SAMSUNG DISPLAY CO., LTD., Yongin-si (KR)

(72) Inventors: Junyoung Jo, Yongin-si (KR); Jaewon Kim, Yongin-si (KR); Hyunae Park, Yongin-si (KR); Junyong An, Yongin-si (KR); Nuree Um, Yongin-si (KR); Youngsoo Yoon, Yongin-si (KR); Ilgoo Youn, Yongin-si (KR); Yunkyeong In, Yongin-si (KR); Donghyeon Jang, Yongin-si (KR); Seunghan Jo, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/539,066

(22) Filed: Aug. 13, 2019

(65) Prior Publication Data
US 2020/0175917 A1 Jun. 4, 2020

(30) Foreign Application Priority Data
Nov. 30, 2018 (KR) .................. 10-2018-0153026

(51) Int. Cl.
*G09G 3/3225* (2016.01)
*G09G 3/3275* (2016.01)
(Continued)

(52) U.S. Cl.
CPC ....... *H01L 27/3279* (2013.01); *G09G 3/3225* (2013.01); *G09G 3/3275* (2013.01);
(Continued)

(58) Field of Classification Search
CPC ...... G09G 3/3225; G09G 3/3275; G09G 3/20; G09G 2300/0426; G09G 2320/0233;
(Continued)

(56) References Cited

U.S. PATENT DOCUMENTS 5,914,763 A * 6/1999 Fujii .................. G02F 1/1345
349/149
6,104,465 A * 8/2000 Na .................. G02F 1/1345
349/152
(Continued)

FOREIGN PATENT DOCUMENTS

KR 10-0578925 5/2006
KR 10-2008-0076519 8/2008
(Continued)

*Primary Examiner* — Darlene M Ritchie
(74) *Attorney, Agent, or Firm* — F. Chau & Associates, LLC

(57) ABSTRACT

A display apparatus includes a substrate including a display area, a first non-display area, a second non-display area, and a bending area between the first non-display area and the second non-display area, a display unit positioned in the display area, a driving circuit positioned in the second non-display area, and a fan-out portion transmitting a data signal applied from the driving circuit to the display unit. The fan-out portion includes a first fan-out portion including first conductive lines, a second fan-out portion including second conductive lines, and a separation area between the first fan-out portion and the second fan-out portion that are separated from each other by a predetermined distance in the bending area. A first width of a first conductive line closest to the separation area and a second width of a second conductive line closest to the separation area are different from each other.

25 Claims, 14 Drawing Sheets

(51) Int. Cl.
  *H01L 27/32* (2006.01)
  *H01L 51/52* (2006.01)
(52) U.S. Cl.
  CPC ...... *H01L 27/3276* (2013.01); *H01L 51/5203* (2013.01); *G09G 2300/0426* (2013.01); *H01L 2251/53* (2013.01)
(58) Field of Classification Search
  CPC .......... G09G 2320/0223; G02F 1/1345; H01L 27/3276; H01L 2251/53; H01L 51/5203
  See application file for complete search history.

(56) References Cited

U.S. PATENT DOCUMENTS

| | | | |
|---|---|---|---|
| 8,102,349 B2 | 1/2012 | Ashizawa et al. | |
| 9,786,229 B2 | 10/2017 | Lee et al. | |
| 2008/0203391 A1* | 8/2008 | Kim | G02F 1/1345 |
| | | | 257/59 |
| 2010/0225624 A1* | 9/2010 | Fu | G09G 3/20 |
| | | | 345/205 |
| 2012/0218219 A1* | 8/2012 | Rappoport | H01L 27/3288 |
| | | | 345/174 |
| 2015/0187279 A1* | 7/2015 | Lee | H01L 51/5203 |
| | | | 257/40 |
| 2017/0262109 A1* | 9/2017 | Choi | G06F 3/0412 |
| 2017/0287936 A1* | 10/2017 | Kim | H01L 27/1218 |
| 2017/0288008 A1* | 10/2017 | Kim | H01L 51/0097 |
| 2018/0286938 A1 | 10/2018 | Moon et al. | |
| 2018/0299719 A1* | 10/2018 | Fujikawa | G02F 1/13454 |
| 2019/0324580 A1* | 10/2019 | Tanaka | H01L 51/56 |
| 2020/0168173 A1* | 5/2020 | Adachi | G02F 1/1345 |

FOREIGN PATENT DOCUMENTS

| | | |
|---|---|---|
| KR | 10-0964768 | 6/2010 |
| KR | 10-2015-0079206 | 7/2015 |
| KR | 10-2017-0073125 | 6/2017 |

* cited by examiner

DISPLAY APPARATUS AND FAN-OUT PORTION

CROSS-REFERENCE TO RELATED APPLICATION

This application claims priority under 35 U.S.C. 119 to Korean Patent Application No. 10-2018-0153026, filed on Nov. 30, 2018 in the Korean Intellectual Property Office, the disclosure of which is incorporated by reference herein in its entirety.

BACKGROUND

1. Field

The present invention relates to a display apparatus, and more particularly, to a display apparatus in which a non-emission area is reduced and luminous uniformity between adjacent pixels is increased.

2. Description of the Related Art

Organic light-emitting display apparatuses among display apparatuses have a wide view angle, excellent contrast, and a fast response speed. Thus, they have come into the spotlight as next-generation display apparatuses.

Organic light-emitting display apparatuses include a thin-film transistor (TFT) and organic light-emitting devices that are formed on a substrate. The organic light-emitting devices emit light autonomously. These organic light-emitting display apparatuses are used in display units for small products, such as mobile phones or display units for large products, such as televisions (TVs).

Display apparatuses, such as these organic light-emitting display apparatuses, include a display unit on the substrate and a fan-out portion having a wiring extending toward one side. At least a portion of these display apparatuses is bent such that visibility at various angles is increased or the area of a non-display area is reduced.

In display apparatuses according to the related art, research on reducing a non-emission area of a portion in which a fan-out portion is positioned, i.e., a dead space, has been continuously carried out. However, there are limitations in reducing the non-emission area by arranging wirings of the fan-out portion according to the related art.

SUMMARY

One or more embodiments include a display apparatus in which the structure of a fan-out area is changed so that a dead space is minimized and luminous uniformity between adjacent pixels is improved.

Additional aspects will be set forth in part in the description which follows and, in part, will be apparent from the description, or may be learned by practice of the presented embodiments.

According to an exemplary embodiment of the present invention, a display apparatus includes a substrate including a display area, a first non-display area adjacent to the display area, a second non-display area, and a bending area between the first non-display area and the second non-display area, a display unit positioned in the display area, a driving circuit positioned in the second non-display area, and a fan-out portion positioned in the first non-display area, the bending area, and the second non-display area between the display unit and the driving circuit and configured to transmit a data signal applied from the driving circuit to the display unit. The fan-out portion includes a first fan-out portion including a plurality of first conductive lines adjacent to one another, a second fan-out portion including a plurality of second conductive lines adjacent to one another, and a separation area between the first fan-out portion and the second fan-out portion. The first fan-out portion and the second fan-out portion are separated from each other by a predetermined distance in the bending area. A first width of one of the plurality of first conductive lines, which is closest to the separation area among the plurality of first conductive lines, and a second width of one of the plurality of second conductive lines, which is closest to the separation area among the plurality of second conductive lines, are different from each other in a part of at least one of the first non-display area, the bending area and the second non-display area.

According to an exemplary embodiment of the present inventive concept, a display apparatus includes a substrate including a display area, a first non-display area adjacent to the display area, a second non-display area, and a bending area between the first non-display area and the second non-display area, a fan-out portion positioned in the first non-display area, the bending area, and the second non-display area with conductive lines continuously arranged in the bending area, and a separation area disposed between the first conductive lines and the second conductive lines. The conductive lines include first conductive lines and second conductive lines. Resistance values of the conductive lines are gradually decreased from an outer edge to a center thereof.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
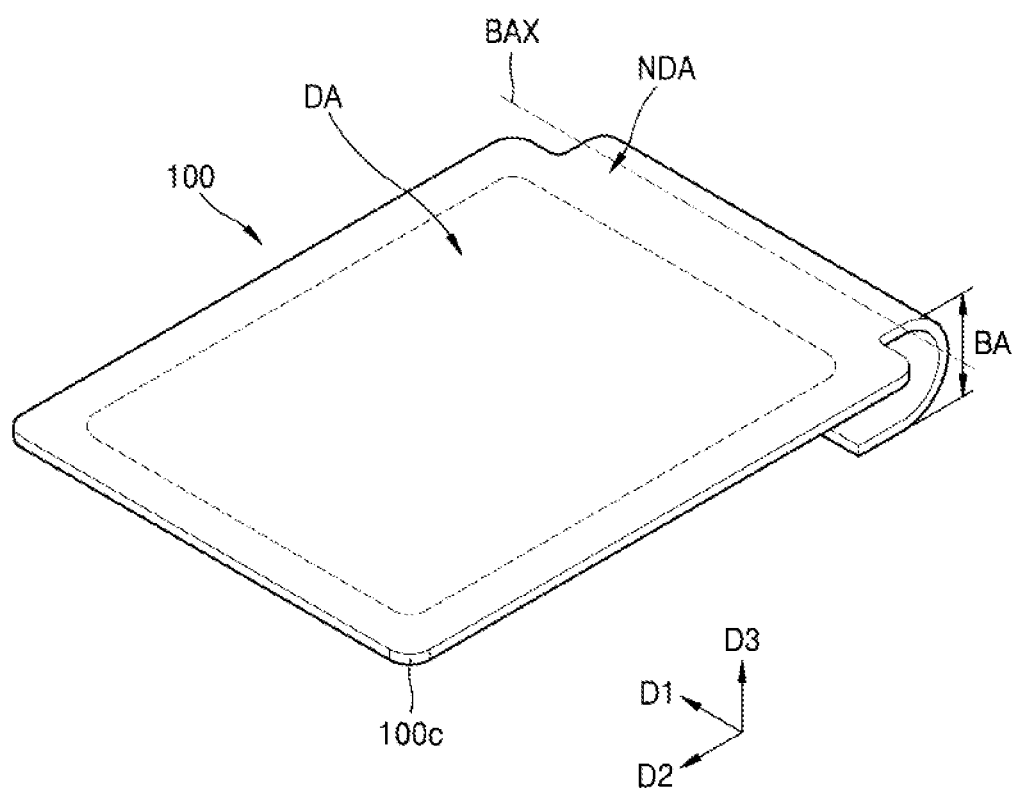
FIG. 1 is a perspective view schematically illustrating a part of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

As the present disclosure allows for various changes and numerous embodiments, particular embodiments will be illustrated in the drawings and described in detail in the written description. The effects and features of the present disclosure, and ways to achieve them will become apparent by referring to embodiments that will be described later in detail with reference to the drawings. However, the present disclosure is not limited to the following embodiments but may be embodied in various forms.

Hereinafter, embodiments of the present disclosure will be described below in more detail with reference to the accompanying drawings. Those components that are the same or are in correspondence are rendered the same reference numeral regardless of the figure number.

It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

A display apparatus according to an embodiment is an apparatus for displaying an image and may be a liquid crystal display (LCD) apparatus, an electrophoretic display apparatus, an organic light-emitting display apparatus, an inorganic electro luminescence (EL) display apparatus, a field emission display (FED) apparatus, a surface-conduction electron-emitter display apparatus, a plasma display apparatus, or a cathode ray display apparatus.

Hereinafter, an organic light-emitting display apparatus will be described as a display apparatus according to an embodiment. However, the display apparatus according to an embodiment is not limited thereto and may be a display apparatus using various methods.

Figure 2:
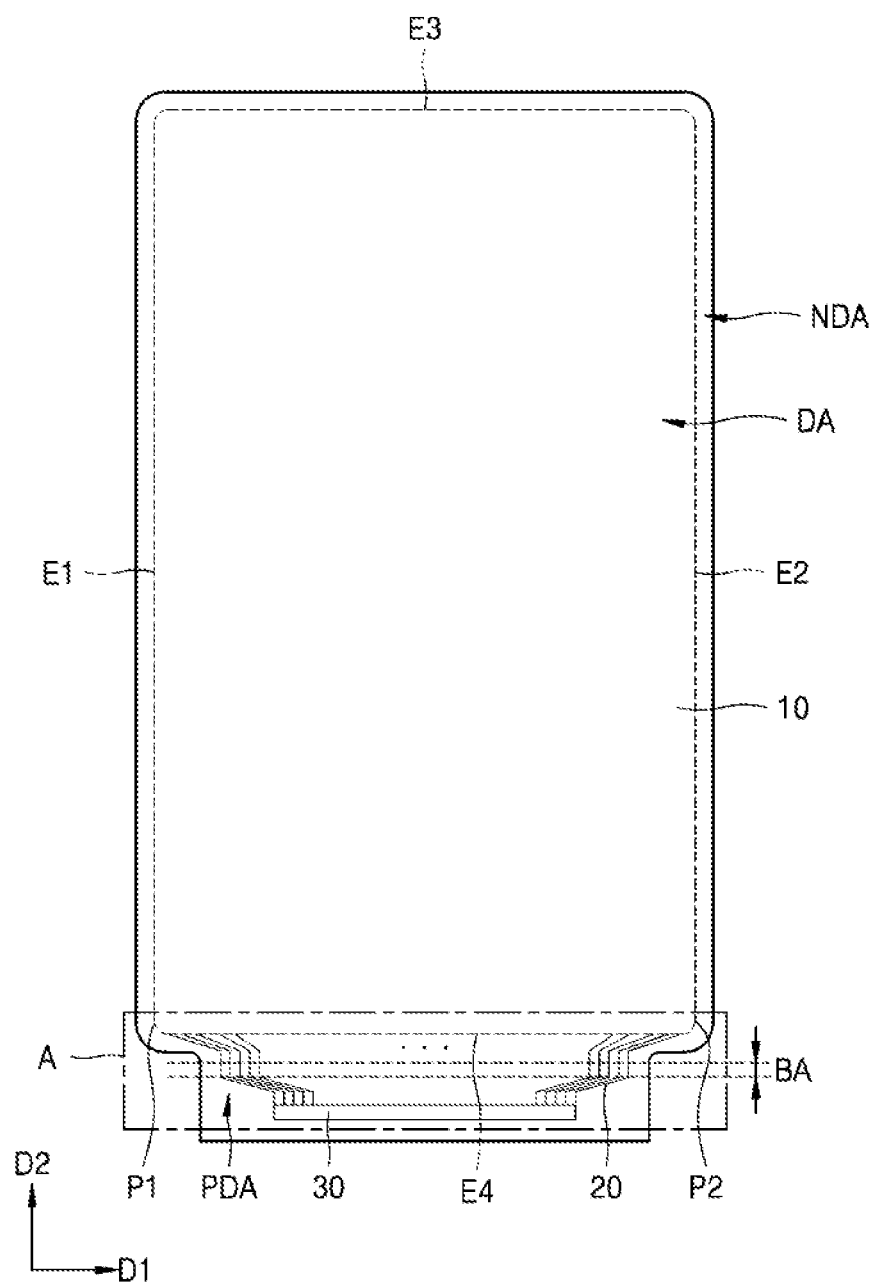
FIG. 2 is a plan view schematically illustrating a part of a display apparatus according to an embodiment.

FIG. 1 is a perspective view schematically illustrating a part of a display apparatus according to an embodiment, and FIG. 2 is a plan view schematically illustrating a part of a display apparatus according to an embodiment.

Referring to FIG. 1, a substrate 100 of a display apparatus 1 according to the present embodiment may include a display area DA, a non-display area NDA around the display area DA, and a bending area BA in which a part of the non-display area NDA is bent. The other region other than the bending area BA may be an area having an approximately flat surface. The bending area BA of the substrate 100 may be bent along a bending axis BAX that extends in a first direction D1, as illustrated in FIG. 1.

The substrate 100 may include various flexible, bendable or rollable materials. For example, the substrate 100 may include polymer resin, such as polyethersulphone (PES), polyacrylate (PAR), polyetherimide (PEI), polyethylene napthalate (PEN), polyethylene terephthalate (PET), polyphenylene sulfide (PPS), polyarylate (PAR), polyimide (PI), polycarbonate (PC), or cellulose acetate propionate (CAP).

The substrate 100 may be variously modified like having a multi-layer structure including two layers including such polymer resin and a barrier layer including an inorganic material (silicon oxide, silicon nitride, or silicon oxynitride) between the two layers. In another embodiment, a substrate of a display, in which the substrate 100 is not required to be bent, may include glass.

In the substrate 100, a width of the non-display area NDA including the bending area BA in the first direction D1 may be less than a width of a portion in which the display area DA is positioned, in the first direction D1. Corner portions 100c of the substrate 100 may be round. This shape may apply to the display area DA, as shown in FIG. 2.

Referring to FIG. 2, the display apparatus may include the display area DA, in which a plurality of pixels are positioned, and the non-display area NDA outside the display area DA, as illustrated in FIG. 1. This may also be understood that the substrate 100 has the display area DA and the non-display area NDA. The non-display area NDA may include a pad area PDA in which various kinds of electronic devices including an integrated circuit (IC), or a printed circuit board (PCB) is electrically attached to one side of the display area DA.

FIG. 2 may also be understood as a plan view illustrating the substrate 100 to be manufactured. In a finally-manufactured display apparatus or an electronic device such as a smartphone including the display apparatus, to minimize the area of the non-display area NDA recognized by a user, a part of the substrate 100 may be bent, as shown in FIG. 1. For example, as illustrated in FIGS. 1 and 2, the substrate 100 may include a first portion having a first width and a second portion having a second width. The first portion of the substrate 100 may correspond to the display area and the second portion of the substrate 100 may correspond to the pad area PDA. The second width of the substrate 100 in the first direction D1 is smaller than the first width of the substrate 100 in the first direction D1. In the second portion of the substrate 100 with a smaller width, the substrate 100 may be bent along the bending axis BAX parallel to the first direction D1.

In this case, at least a part of the pad area PDA may be bent to overlap the display area DA. For example, a bending direction of the pad area PDA may be set so that the pad area PDA does not shield the display area DA but is positioned behind the display area DA. Thus, the user may recognize that the display area DA takes most part of the display apparatus 1.

Edges of the display area DA may have similar shapes to rectangular or square shapes overall. In detail, the display area DA may include a first edge E1 and a second edge E2 that face each other and a third edge E3 and a fourth edge E4 that face each other between the first edge E1 and the second edge E2. The pad area PDA is adjacent to the fourth edge E4 among the first through fourth edges E1, E2, E3, and E4. In this case, the display area DA may have round corner portions. For example, a first corner portion P1 of the display area DA that connects the first edge E1 to the fourth edge E4 may be round, and a second corner portion P2 of the display area DA that connects the second edge E2 to the fourth edge E4 may be round. The other corner portions of the display area DA may also be round.

A display unit 10 including a plurality of pixels may be positioned in the display area DA. A fan-out portion 20, in which conductive lines extend, may be positioned in the pad area PDA. One side of the fan-out portion 20 may be connected to the display unit 10, and the other side of the fan-out portion 20 may be connected to a driving circuit portion 30. The driving circuit portion 30 may include various kinds of electronic devices including an integrated circuit (IC).

Figure 3:
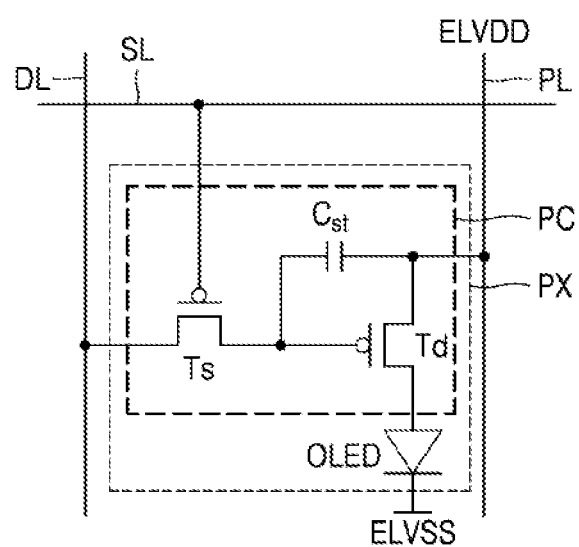
FIG. 3 is a circuit diagram schematically illustrating a pixel of a display apparatus according to an embodiment.

FIG. 3 is a circuit diagram schematically illustrating a pixel of a display apparatus according to an embodiment.

Referring to FIG. 3, a pixel PX may include a pixel circuit PC connected to a scan line SL and a data line DL and an organic light-emitting device (OLED) connected to the pixel circuit PC. The pixel circuit PC may include a driving thin-film transistor (TFT) Td, a switching TFT Ts, and a storage capacitor Cst. The switching TFT Ts may be connected to the scan line SL and the data line DL and may transmit data signals received through the data line DL according to scan signals received through the scan line SL.

The storage capacitor Cst may be connected to the switching TFT Ts and a driving voltage line PL and may store a voltage that corresponds to a difference between a voltage transmitted from the switching TFT Ts and a driving voltage ELVDD supplied to the driving voltage line PL.

The driving TFT Td may be connected to the driving voltage line PL and the storage capacitor Cst and may control a driving current that flows through the OLED from the driving voltage line PL in response to a value of the voltage stored in the storage capacitor Cst. The OLED may emit light having a brightness according to the driving current. The OLED may emit red, green, blue or white light, for example.

In FIG. 3, the pixel PX includes two TFTs and one storage capacitor. However, embodiments are not limited thereto. In another embodiment, the pixel circuit PC of the pixel PX may be modified in various ways like including three or more TFTs or two or more storage TFTs.

Figure 4:
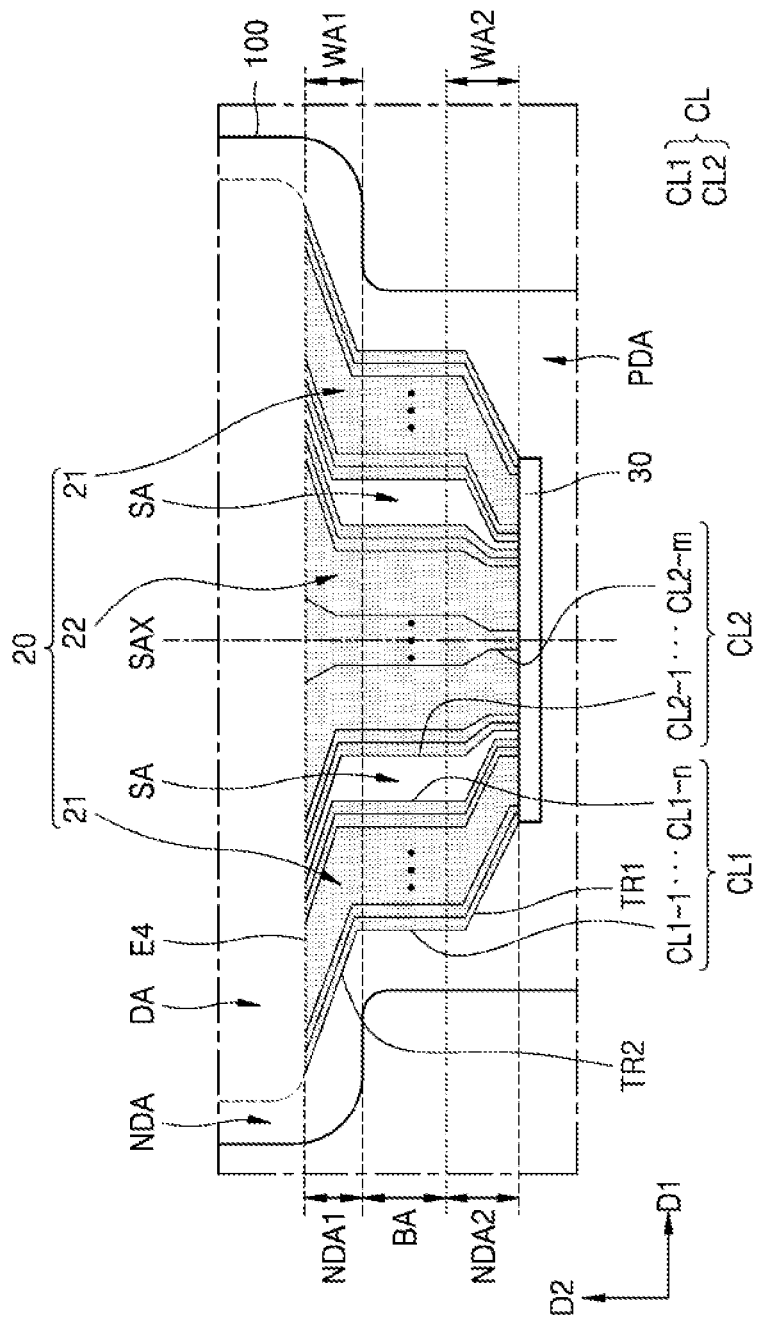
FIG. 4 is an enlarged plan view schematically illustrating a region A of FIG. 2.

FIG. 4 is an enlarged plan view schematically illustrating a region A of FIG. 2.

Referring to FIG. 4, the non-display area NDA may include a first non-display area NDA1, a second non-display area NDA2, and a bending area BA in addition to the non-display area NDA that surrounds the display area DA.

The first non-display area NDA1 and the second non-display area NDA2 may be defined based on the bending area BA. The first non-display area NDA1 that is adjacent to the fourth edge E4 of the display area DA is an area between the display area DA and the bending area BA. The second non-display area NDA2 that is not recognized from the front when the bending area BA is bent, is an area between the bending area BA and the driving circuit portion 30. The bending area BA may be positioned between the first non-display area NDA1 and the second non-display area NDA2.

As described above, the first non-display area NDA1 may be a non-display area NDA recognized by the user of an electronic device such as a finally-manufactured display apparatus or a smartphone including the display apparatus, like the non-display area NDA that contacts the first through third edges E1, E2, and E3 of the display area DA, as shown in FIG. 2. The fan-out portion 20 is positioned in the first non-display area NDA1. Thus, it is not easy to reduce the width of an area where the fan-out portion 20 is positioned compared to another non-display area, i.e., a non-display area that contacts the first through third edges E1, E2, and E3 of the display area DA. The area with fan-out portion 20 may be bent behind the display unit 10 so that the appearance of the display apparatus 1 has less area on the fourth edge E4 of the display area DA.

In the display apparatus 1 according to an embodiment, the fan-out portion 20 is designed to be divided into a "plurality of sections" such that a width WA1 of the first non-display area NDA1 may be reduced. The "plurality of sections" may be understood to correspond to a first fan-out portion 21 and a second fan-out portion 22 of the fan-out portion 20. Thus, in the present embodiment, the width WA1 of the first non-display area NDA1 may be less than a width WA2 of the second non-display area NDA2.

As shown in FIG. 4, the fan-out portion 20 may include the first fan-out portion 21 and the second fan-out portion 22, which are positioned in the bending area BA with a separation area SA. In an example embodiment, the first fan-out portion 21 may be separated from the second fan-out portion 22 via the separation area SA. In an example embodiment, the first fan-out portion 21 and the second fan-out portion 22 may be positioned in a mirror-symmetric manner with respect to a symmetry axis SAX.

The fan-out portion 20 may include a plurality of conductive lines CL. The plurality of conductive lines CL may include, for example, a data line DL that transmits the data signals applied from the driving circuit portion 30 to the display unit 10.

The plurality of conductive lines CL may be positioned to sequentially pass through the first non-display area NDA1, the bending area BA, and the second non-display area NDA2. On a plane, as shown in FIG. 4, the plurality of conductive lines CL may be bent at least twice or more. For example, each of the conductive lines CL may extend in a first oblique direction in the second non-display area NDA2 and then turn in the second direction D2 at a first turning point (or first turning region) TR1. The conductive line may further extend through the bending area BA and turn in a second oblique direction at a second turning point (or turning region) TR2 which is in the first non-display area NDA1. The first turning point TR1 and the second turning point TR2, in which the plurality of conductive lines CL are bent into a different direction, may be positioned in the first non-display area NDA1 and the second non-display area NDA2. Because stress is concentrated on the bending area BA, the plurality of conductive lines CL are bent in the first non-display area NDA1 and the second non-display area NDA2 to avoid risk of a short-circuit due to the stress concentration.

The plurality of conductive lines CL may extend in an oblique direction that intersects the first direction D1 and the second direction D2 in the first non-display area NDA1 and the second non-display area NDA2 and may extend in a direction approximately parallel to the second direction D2 in the bending area BA. A part of each of the plurality of conductive lines CL in the bending area BA may be connected to a part thereof in the first non-display area NDA1 to a part thereof in the second non-display area NDA2.

In an embodiment, as shown in FIG. 4, the first fan-out portion 21 may be positioned at both sides of the second fan-out portion 22. The fan-out portion 20 may entirely have a symmetric shape with respect to the symmetry axis SAX. The first fan-out portion 21 may include two first fan-out portions. One of the two first fan-out portions is positioned at one side of the second fan-out portion 22 and the other is positioned at the other side of the second fan-out portion 22. The two first fan-out portions may be symmetrically positioned with respect to the symmetry axis SAX. The second fan-out portion 22 may be positioned between the two first fan-out portions of the first fan-out portion 21. The second fan-out portion 22 may have a symmetric shape with respect to the symmetry axis SAX. The first fan-out portion 21 may be positioned at one side and the other side of the second fan-out portion 22. In an embodiment, the first fan-out portion 21 and the second fan-out portion 22 may be separated from each other by the separation area SA.

Figure 13:
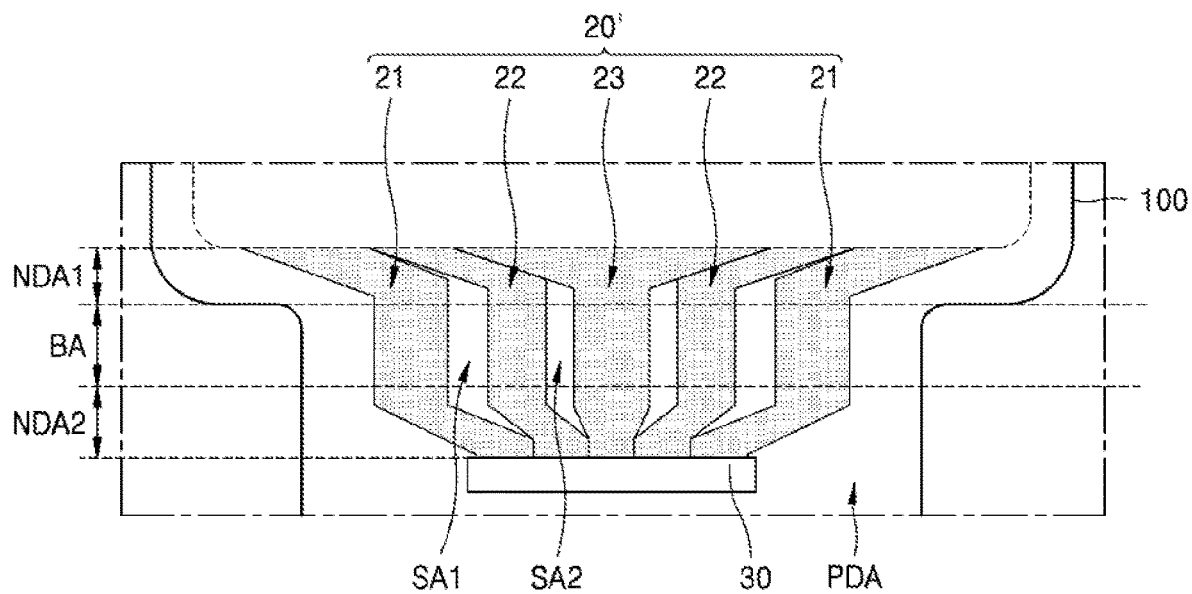
FIGS. 13 and 14 are plan views schematically illustrating display apparatuses according to other embodiments.
Figure 14:
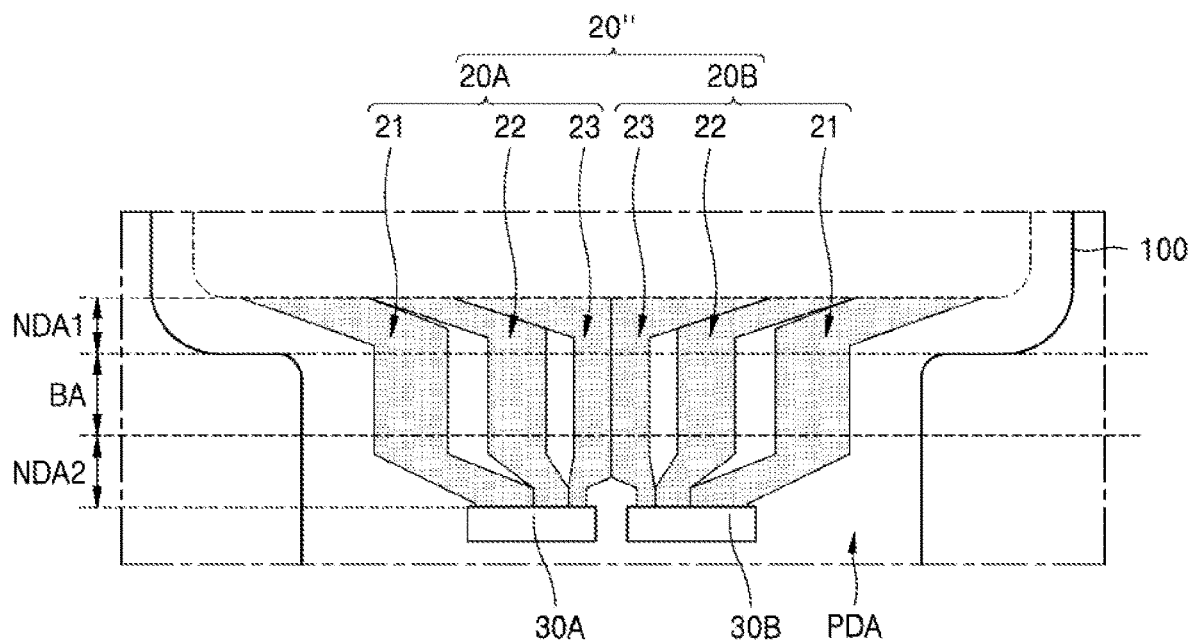

In another embodiment, as shown in FIGS. 13 and 14, the fan-out portion 20 may include a fan-out portion divided into three sections or more.

The first fan-out portion 21 may include a plurality of first conductive lines CL1. The plurality of first conductive lines CL1 may include n first conductive lines including a first-first conductive line CL1-1 through a (n-th)-first conductive line CL1-$n$. The second fan-out portion 22 may include a plurality of second conductive lines CL2. The plurality of second conductive lines CL2 may include m second conductive lines including a first second conductive line CL2-1 through a (m-th)-second conductive line CL2-$m$. In this case, the number of first conductive lines CL1 and the number of second conductive lines CL2 may be the same or different from each other.

The plurality of first conductive lines CL1 of the first fan-out portion 21 may have different lengths. For example, a length of each of the plurality of first conductive lines CL1 may be gradually decreased in the order from the first-first conductive line CL1-1 to the (n-th)-first conductive line CL1-$n$. The length of each of the plurality of first conductive lines CL1 may be proportional to resistance. Thus, as the length of each of the plurality of first conductive lines CL1 is decreased in the order from the first-first conductive line CL1-1 to the (n-th)-first conductive line CL1-$n$, a corresponding resistance value is decreased in the order from the first conductive line CL1-1 to the (n-th)-first conductive line CL1-$n$.

In this way, the resistance values of the conductive lines are gradually decreased in the order from the first-first conductive line CL1-1 to the (n-th)-first conductive line CL1-$n$. A difference in the resistance values of the conductive lines may cause an RC delay difference between pixels connected to the conductive lines CL. However, as described above, as the resistance values of the conductive lines are gradually decreased in the order from the first-first conductive line CL1-1 to the (n-th)-first conductive line CL1-$n$, the RC delay difference between pixels is not recognized by the user. In other words, two adjacent first conductive lines of the first conductive lines CL1 may have a length difference corresponding to a difference in RC delays thereof which does not cause any visibility problems such as an emission difference or color deviation between a pixel recognized by the user.

To attain the above-described effects, the resistance values of the plurality of second conductive lines CL2 of the second fan-out portion 22 adjacent to the first fan-out portion 21 also have to be gradually decreased in succession to the plurality of first conductive lines CL1. In particular, the resistance value of the first-second conductive line CL2-1 of the second fan-out portion 22, which is adjacent to the (n-th)-first conductive line CL1-$n$ of the first fan-out portion 21, has to be gradually decreased, like in the plurality of first conductive lines CL1. The first fan-out portion 21 and the second fan-out portion 22 are just distinguished from each other only in the pad area PDA and are wirings that are continuously arranged in the display area DA.

In this way, in order for the plurality of second conductive lines CL2 in succession to the plurality of first conductive lines CL1 to have a tendency in which the resistance values of the first and second conductive lines CL1 and CL2 are gradually decreased, a length of the first-second conductive line CL2-1 has to be less than that of the (n-th)-first conductive line CL1-$n$. Generally, in a structure of a wiring with the same thickness (height) of a cross-section of the wiring, a resistance value is proportional to the length and inverse proportional to the width.

However, in the display apparatus 1 according to the present embodiment, due to the separation area between the first fan-out portion 21 and the second fan-out portion 22, the length of the first-second conductive line CL2-1 may be greater than that of the (n-th)-first conductive line CL1-$n$. In this case, when the resistances of the plurality of first conductive lines CL1 that are gradually decreased are suddenly increased in the first-second conductive lines CL2-1, visibility problems like an emission difference or color deviation between a pixel (not shown) connected to the (n-th) first conductive line CL1-$n$ and a pixel (not shown) connected to the first second conductive line CL2-1 may occur.

To solve these problems, the display apparatus 1 according to an embodiment has been designed in such a way that the width of the first-second conductive line CL2-1 is changed and thus resistance of the first-second conductive line CL2-1 is less than and gradually changed from that of the (n-th)-first conductive line CL1-$n$. This will be described in detail with reference to FIGS. 5 and 6.

Figure 5:
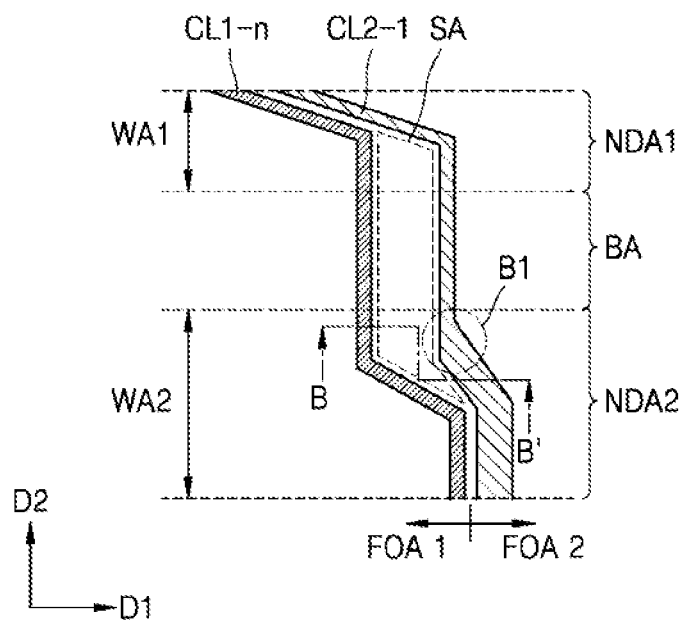
FIG. 5 is an enlarged plan view schematically illustrating a part of the display apparatus of FIG. 4.
Figure 6:
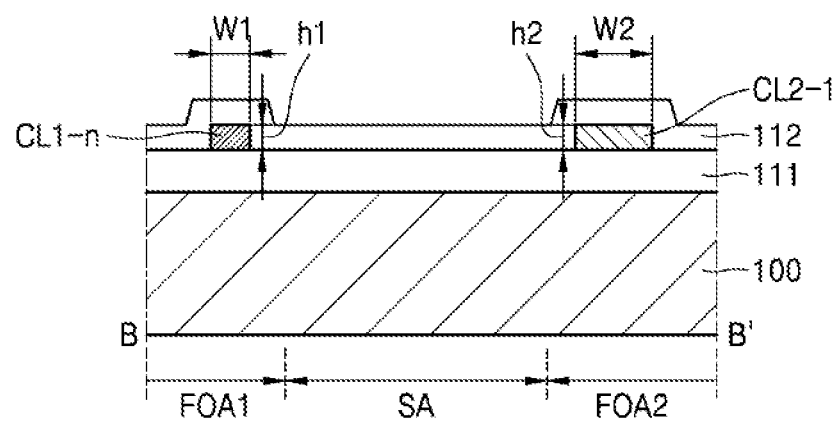
FIG. 6 is a cross-sectional view schematically illustrating a cross-section taken along a line B-B' of FIG. 5.

FIG. 5 is an enlarged plan view schematically illustrating a part of the display apparatus of FIG. 4, and FIG. 6 is a cross-sectional view schematically illustrating a cross-section taken along line B-B' of FIG. 5.

In FIGS. 5 and 6, the (n-th)-first conductive line CL1-$n$ and the first-second conductive line CL2-1 that are adjacent to one another, are shown. The (n-th)-first conductive line CL1-$n$ is positioned at the left side of the CL2. The symmetric counterpart of the (n-th)-first conductive line CL1-$n$ and the first-second conductive line CL2-1 is present in the right side of the plurality of second conductive lines CL2. The remaining conductive lines that are arranged in succession to the (n-th)-first conductive line CL1-$n$ and the first-second conductive line CL2-1, are omitted for convenience of explanation.

The separation area SA may be formed between the (n-th)-first conductive line CL1-n and the first-second conductive line CL2-1 that are adjacent to one another. The separation area SA may overlap the bending area BA mostly, and a part of the separation area SA may extend into the first non-display area NDA1 and the second non-display area NDA2.

Referring to FIGS. 5 and 6, in at least a part of an area of the first-second conductive line CL2-1 may have a width W2 that is greater than a width W1 of the (n-th)-first conductive line CL1-n. In an embodiment, in the second non-display area NDA2, the width W2 of the first-second conductive line CL2-1 may be greater than the width W1 of the (n-th)-first conductive line CL1-n.

Of course, the widths of the conductive lines in the first non-display area NDA1 and/or the bending area BA may be adjusted. However, because, as described above, the width WA1 of the first non-display area NDA1 is less than the width WA2 of the second non-display area NDA2 so as to reduce a dead space, it is not easy in terms of design to expand the widths of the conductive lines in the first non-display area NDA1. Also, because the bending area BA is vulnerable to stress, it may be not easy in terms of design to expand the widths of the conductive lines.

As described above in FIG. 4, the plurality of first conductive lines CL1 and the plurality of second conductive lines CL2 may be bent in the first non-display area NDA1 and the second non-display area NDA2. Thus, the (n-th)-first conductive line CL1-n and the first-second conductive line CL2-1 of FIG. 5 may also be bent in the first non-display area NDA1 and the second non-display area NDA2. In FIG. 5, a width of the first-second conductive line CL2-1 is increased in a bending portion B1. However, embodiments are not limited thereto.

Referring to FIG. 6, the (n-th)-first conductive line CL1-n and the first-second conductive line CL2-1 may be arranged on the substrate 100. The (n-th)-first conductive line CL1-n may be arranged in the first fan-out area FOA1, and the first-second conductive line CL2-1 may be arranged in the second fan-out area FOA2.

A first insulating layer 111 may be between the substrate 100, the (n-th)-first conductive line CL1-n and the first-second conductive line CL2-1, and a second insulating layer 112 may be positioned on the (n-th)-first conductive line CL1-n and the first-second conductive line CL2-1. For example, the first insulating layer 111 may be a buffer layer 110 and/or a gate insulating layer 120 of FIG. 12, and the second insulating layer 112 may be a first interlayer insulating layer 130 of FIG. 12. As described above, the separation area SA may be between the (n-th)-first conductive line CL1-n and the first-second conductive line CL2-1.

The width W2 of the first-second conductive line CL2-1 in the second non-display area NDA2 may be greater than the width W1 of the (n-th)-first conductive line CL1-n. In this case, a thickness (height) h1 of the (n-th)-first conductive line CL1-n may be the same as a thickness (height) h2 of the first-second conductive line CL2-1.

Figure 7:
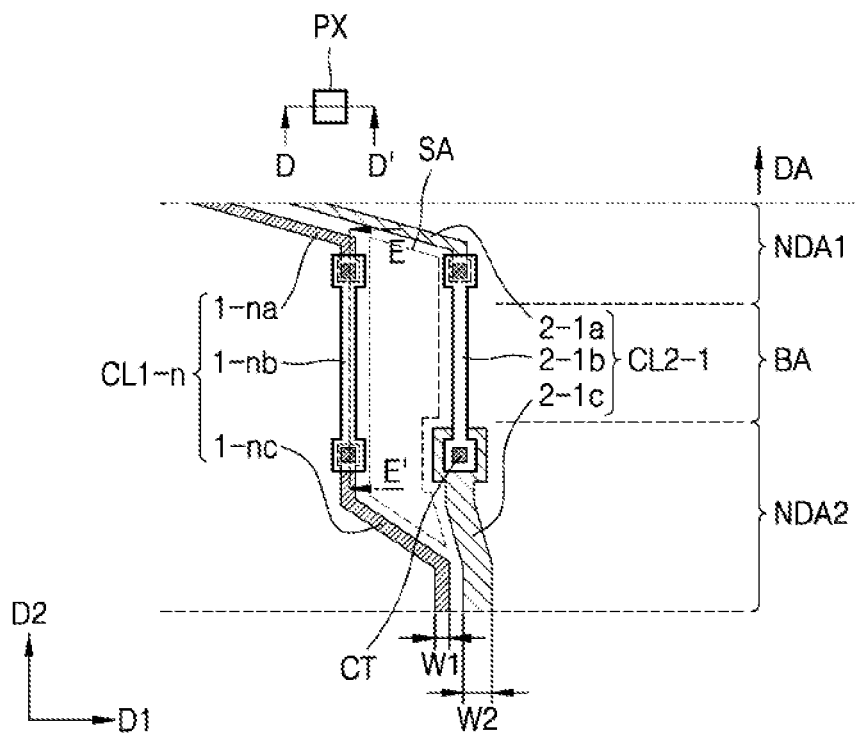
FIG. 7 is an enlarged plan view schematically illustrating a part of a display apparatus according to another embodiment.

In an embodiment, as shown in FIG. 7, the (n-th)-first conductive line CL1-n may include a first upper conductive layer 1-na positioned in the first non-display area NDA1, a first lower conductive layer 1-nc positioned in the second non-display area NDA2, and a first connection conductive layer 1-nb positioned in the bending area BA. The first upper conductive layer 1-na, the first lower conductive layer 1-nc and the first connection conductive layer 1-nb may be referred to as an upper (n-th)-first conductive layer, a lower (n-th)-first conductive layer and a connection (n-th)-first conductive layer respectively. The first upper conductive layer 1-na and the first lower conductive layer 1-nc may be positioned on the same layer, and the first connection conductive layer 1-nb may be positioned on a different layer from the first upper conductive layer 1-na and the first lower conductive layer 1-nc. For example, an insulating layer (not shown) may be between the first upper conductive layer 1-na, the first lower conductive layer 1-nc, and the first connection conductive layer 1-nb. The first upper conductive layer 1-na and the first connection conductive layer 1-nb and the first lower conductive layer 1-nc and the first connection conductive layer 1-nb may be electrically connected to one another via a contact hole CT defined in the insulating layer (not shown).

Similarly, the first-second conductive line CL2-1 may include a second upper conductive layer 2-1a disposed in the first non-display area NDA1, a second lower conductive layer 2-1c disposed in the second non-display area NDA2, and a second connection conductive layer 2-1b disposed in the bending area BA. The second upper conductive layer 2-1a, the second lower conductive layer 2-1c and the second connection conductive layer 2-1b may be referred to as an upper first-second conductive layer, a lower first-second conductive layer and a connection first-second conductive layer respectively. The second upper conductive layer 2-1a and the second lower conductive layer 2-1c may be disposed on the same layer, and the second connection conductive layer 2-1b may be disposed on a different layer from the second upper conductive layer 2-1a and the second lower conductive layer 2-1c. For example, an insulating layer (not shown) may be between the second upper conductive layer 2-1a, the second lower conductive layer 2-1c, and the second connection conductive layer 2-1b. The second upper conductive layer 2-1a and the second connection conductive layer 2-1b and the second lower conductive layer 2-1c and the second connection conductive layer 2-1b may be electrically connected to one another via a contact hole CT defined in an insulating layer (not shown).

In FIG. 7, a width W2 of the second lower conductive layer 2-1c may be greater than a width W1 of the first lower conductive layer 1-nc. In this case, widths of the other conductive layers than the second lower conductive layer 2-1c may be the same.

In FIG. 7, the (n-th)-first conductive line CL1-n and the first-second conductive line CL2-1 are illustrated as a representative. However, this structure may apply to the plurality of first conductive lines CL1 and the plurality of second conductive lines CL2 that are shown in FIG. 7.

Thus, in the display apparatus 1 according to the present embodiment, the width W2 of the first-second conductive line CL2-1 may be greater than the width W1 of the (n-th)-first conductive line CL1-n in the second non-display area NDA2 so that resistance of the first-second conductive line CL2-1 may be lower than resistance of the (n-th)-first conductive line CL1-n.

Figure 8:
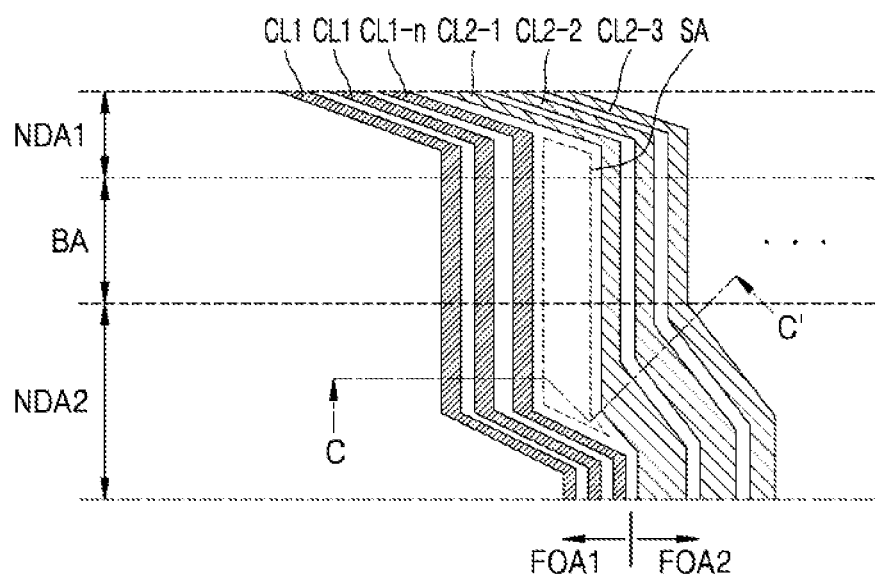
FIG. 8 is an enlarged plan view schematically illustrating a part of a display apparatus according to another embodiment.
Figure 9:
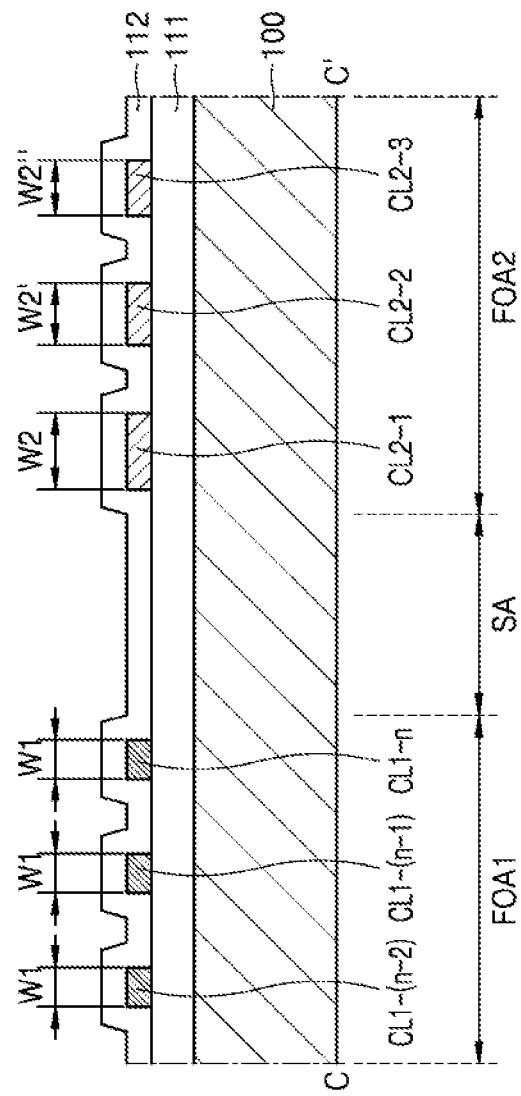
FIG. 9 is a cross-sectional view schematically illustrating a cross-section taken along a line C-C' of FIG. 8.

FIG. 8 is an enlarged plan view schematically illustrating a part of a display apparatus according to another embodiment, and FIG. 9 is a cross-sectional view schematically illustrating a cross-section taken along line C-C' of FIG. 8. FIG. 8 corresponds to a modified embodiment of FIG. 5.

In FIGS. 8 and 9, the (n-th)-first conductive line CL1-n and the first-second conductive line CL2-1 are adjacent to each other, and the second-second conductive line CL2-2 and the third-second conductive line CL2-3 are adjacent to the first-second conductive line CL2-1. The first conductive lines CL1 adjacent to the (n-th)-first conductive line CL1-n may include ((n−2)-th)-first conductive line CL1-(n−2) and ((n−1)-th)-first conductive line CL1-(*n*−1) arranged in the listed order from the first-first conductive line CL1-1 of FIG. 4. For convenience of explanation, a part of wirings arranged in succession to the (n-th)-first conductive line CL1-*n* and the first-second conductive line CL2-1 is illustrated in FIGS. 8 and 9.

A separation area SA may be formed between the (n-th)-first conductive line CL1-*n* and the first-second conductive line CL2-1 that are adjacent to each other. The separation area SA may overlap the bending area BA mostly, and a part of the separation area SA may extend into the first non-display area NDA1 and the second non-display area NDA2.

Referring to FIGS. 8 and 9, the width W2 of the first-second conductive line CL2-1 in the second non-display area NDA2 may be greater than the width W1 of the (n-th)-first conductive line CL1-*n*. The reason why the width W2 of the first-second conductive line CL2-1 in the second non-display area NDA2 is large, is the same as described with reference to FIG. 5 above.

As described above, the conductive lines disposed in the pad area PDA may have resistances according to the following inequalities.

[Sizes of Resistances]
first-first conductive line CL1-1>second-first conductive line CL1-2> . . . >(n-th)-first conductive line CL1-*n*

(n-th)-first conductive line CL1-*n*>first-second conductive line CL2-1 first-second conductive line CL2-1>second-second conductive line CL2-2> . . . >(m-th)-second conductive line CL2-*m*

To this end, as shown in FIGS. 5 and 6, the width W2 of the first-second conductive line CL2-1 may be greater than the width W1 of the (n-th)-first conductive line CL1-*n*.

Also, a width W2' of the second-second conductive line CL2-2 adjacent to the first-second conductive line CL2-1 and a width W2" of the third-second conductive line CL2-3 may also be increased. For example, when the length of the second-second conductive line CL2-2 is still greater than the length of the (n-th)-first conductive line CL1-*n*, the width W2' of the second-second conductive line CL2-2 may be increased so that resistances of the second-second conductive line CL2-2 may be adjusted. This may apply to the third-second conductive line CL2-3 and conductive lines in succession thereto.

In the present embodiment, the width W2 of the first-second conductive line CL2-1, the width W2' of the second-second conductive line CL2-2, and the width W2" of the third-second conductive line CL2-3 may be different from one another. In an embodiment, the width W2 of the first-second conductive line CL2-1 may be the largest, and the width W2' of the second-second conductive line CL2-2 and the width W2" of the third-second conductive line CL2-3 in the listed order may be gradually decreased. In an embodiment, on the contrary to this, the width W2 of the first-second conductive line CL2-1 may be the smallest, and the width W2' of the second-second conductive line CL2-2 and the width W2" of the third-second conductive line CL2-3 in the listed order may be gradually increased.

For example, the plurality of second conductive lines CL2 have to be gradually smaller starting from the first-second conductive line CL2-1 so that resistance values of the conductive lines may be adjusted by changing widths thereof.

Figure 16:
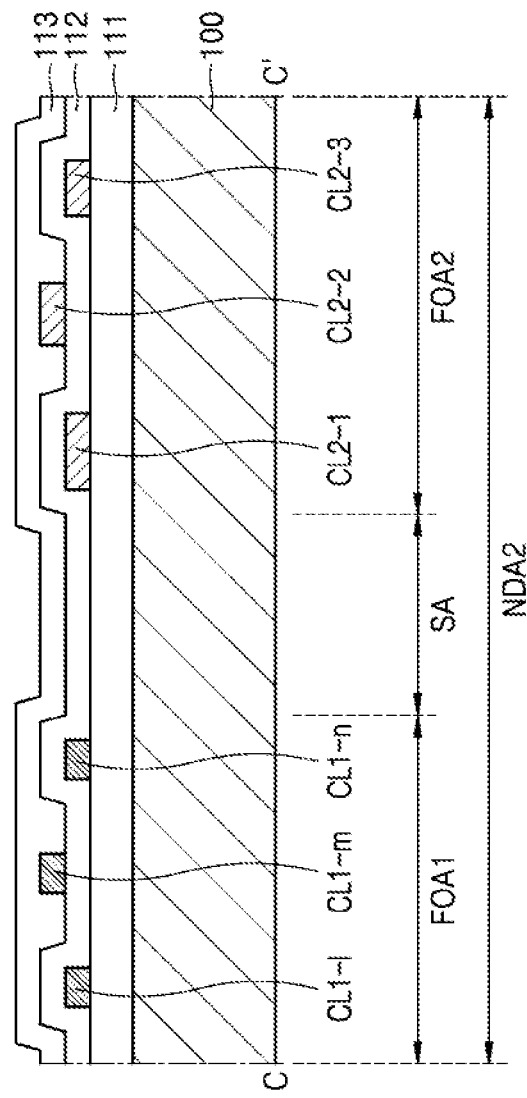

FIG. 16 illustrates a structure in which conductive lines are alternately arranged on different layers, according to a modified embodiment of FIG. 7. For example, adjacent conductive lines may be arranged on different layers.

Referring to FIG. 16, a (I-th)-first conductive line CL1-1 and an (n-th)-first conductive line CL1-*n* may be positioned on the first insulating layer 111, and an (m-th)-first conductive line CL1-*m* between the (I-th)-first conductive line CL1-1 and the (n-th)-first conductive line CL1-*n* may be positioned on the second insulating layer 112. Similarly, a first-second conductive line CL2-1 and a third-second conductive line CL2-3 may be positioned on the first insulating layer 111, and a second-second conductive line CL2-2 between the first-second conductive line CL2-1 and the third-second conductive line CL2-3 may be positioned on the second insulating layer 112. A third insulating layer 113 may be further positioned on the (m-th)-first conductive line CL1-*m* and the second-second conductive line CL2-2.

Figure 17:
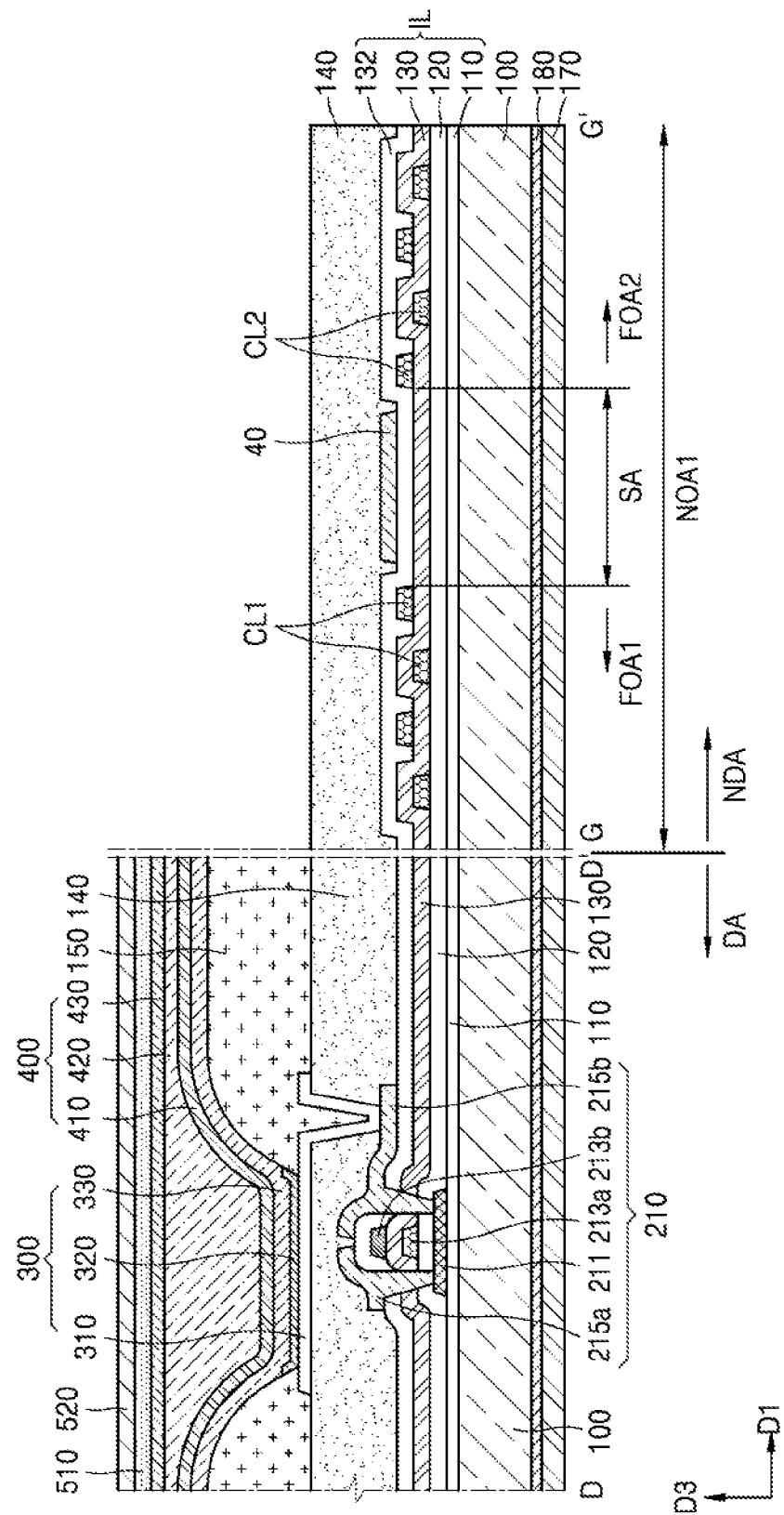

The first insulating layer 111, the second insulating layer 112, and the third insulating layer 113 of FIG. 16 may correspond to a gate insulating layer 120, a first interlayer insulating layer 130, and a second interlayer insulating layer 132 of FIG. 17.

Figure 10:
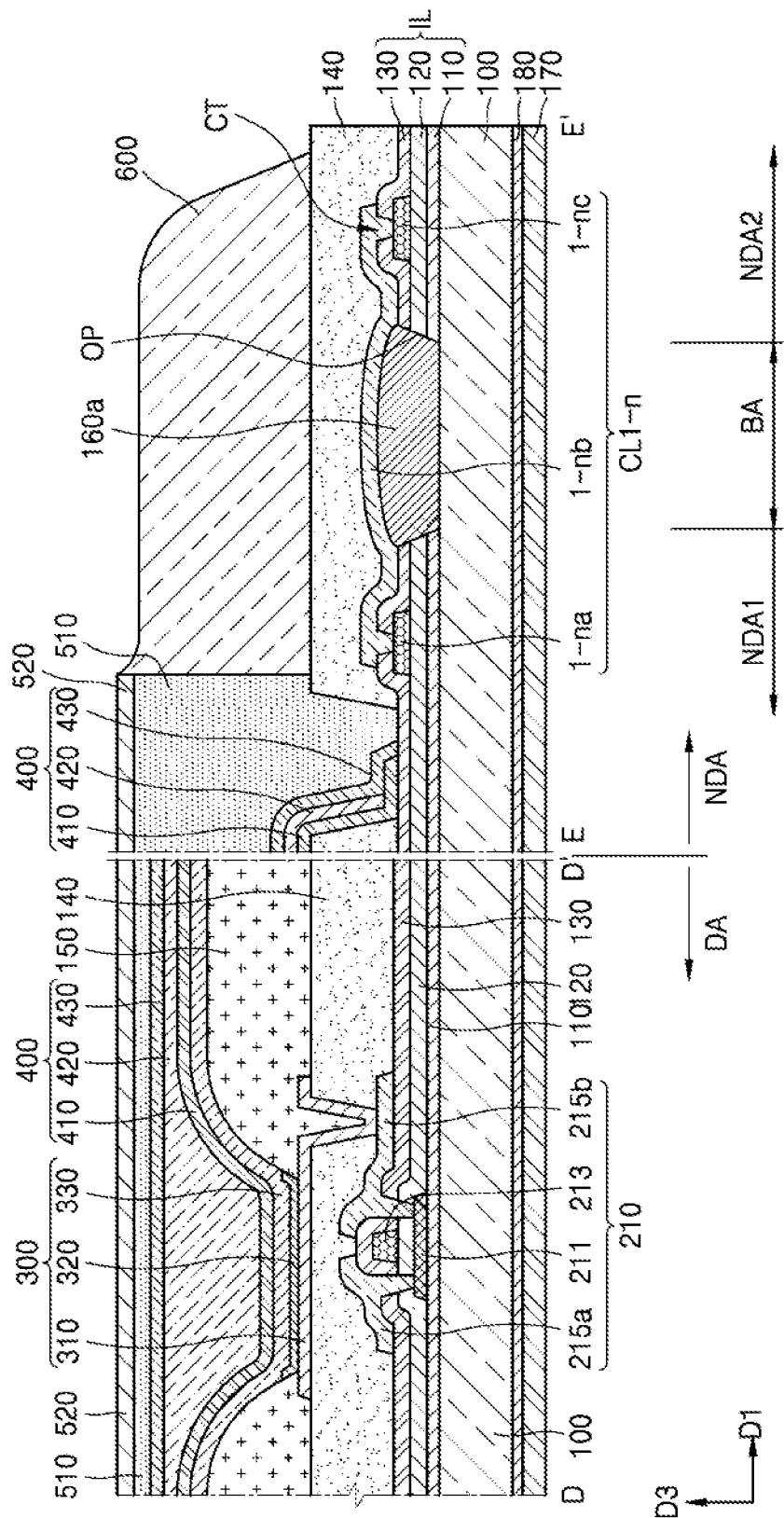
FIG. 10 is a cross-sectional view schematically illustrating a display apparatus according to another embodiment.

FIG. 10 is a cross-sectional view schematically illustrating a display apparatus according to another embodiment. FIG. 10 corresponds to a cross-section taken along lines D-D' and E-E' of FIG. 7.

Referring to FIG. 10, a TFT 210 to which an OLED 300 is electrically connected, as described above, may be positioned in the display area DA in addition to a light emitting device such as the OLED 300. For the OLED 300 electrically connected to the TFT 210, a pixel electrode 310 of the OLED 300 is electrically connected to the TFT 210.

In an example embodiment, a TFT (not shown) may be positioned in the non-display area NDA outside the display area DA of the substrate 100. The TFT positioned in the non-display area NDA may be a part of a circuit portion for controlling electrical signals applied to the display area DA, for example.

The TFT 210 may include a semiconductor layer 211, a gate electrode 213, a source electrode 215*a*, and a drain electrode 215*b* including amorphous silicon, polycrystalline, or an organic semiconductor material.

To insulate between the semiconductor layer 211 and the gate electrode 213, the gate insulating layer 120 may be disposed between the semiconductor layer 211 and the gate electrode 213. The gate insulating layer 120 may include an inorganic material such as silicon oxide, silicon nitride and/or silicon oxynitride. Furthermore, the first interlayer insulating layer 130 may be positioned on the gate electrode 213, the first interlayer insulating layer 130 including an inorganic material such as silicon oxide, silicon nitride and/or silicon oxynitride, and the source electrode 215*a* and the drain electrode 215*b* may be positioned on the first interlayer insulating layer 130. In this way, the insulating layer including the inorganic material may be formed by chemical vapor deposition (CVD) or atomic layer deposition (ALD). This also applies to embodiments that will be described later and modified embodiments thereof.

A buffer layer 110 may be disposed between the TFT 210 and the substrate 100. The buffer layer 110 may include an inorganic material such as silicon oxide, silicon nitride and/or silicon oxynitride. The buffer layer 110 may improve smoothness of a top surface of the substrate 100, preventing an impurity from the substrate 100 from penetrating into the semiconductor layer 211 of the TFT 210 or minimizing the penetration.

A planarization layer 140 may be positioned on the TFT 210. For example, when the OLED 300 is positioned on the TFT 210, as shown in FIG. 10, the planarization layer 140 may planarize an upper portion of a protection layer for covering the TFT 210.

The planarization layer 140 may be formed of an organic material such as acryl, benzocyclobutene (BCB), or hexamethyldisiloxane (HMDSO). In FIG. 10, the planarization layer 140 is shown as a single layer. The present invention, however, is not limited thereto. In an example embodiment, the planarization layer 140 may have a multi-layer structure. As illustrated in FIG. 10, the planarization layer 140 has an opening outside the display area DA so that a portion of the planarization layer 140 of the display area DA and a portion of the planarization layer 140 of the non-display area NDA may be physically separated from each other. This is to prevent an impurity penetrated from the outside from reaching an inside of the display area DA through the planarization layer 140.

In the display area DA, the OLED 300 may be positioned on the planarization layer 140, the OLED 300 including the pixel electrode 310, an opposite electrode 330, and an intermediate layer 320 between the pixel electrode 310 and the opposite electrode 330 and including an emission layer.

The pixel electrode 310 may be in contact with one of the source electrode 215*a* and the drain electrode 215*b* through the opening formed in the planarization layer 140, as shown in FIG. 10, and may be electrically connected to the TFT 210.

A pixel-defining layer 150 may be disposed on the planarization layer 140. The pixel-defining layer 150 has an opening corresponding to sub-pixels, i.e., an opening through which at least the central part of the pixel electrode 310 is exposed, thereby defining a pixel. Also, as shown in FIG. 10, as the opening of the pixel-defining layer 150 increases, a distance between an edge of the pixel electrode 310 and a portion of the opposite electrode 330 increases so that an electric arc is prevented from occurring between the edge of the pixel electrode 310 and the portion of the opposite electrode 330. The pixel-defining layer 150 may be formed of an organic material such as polyimide or HMDSO, for example.

The intermediate layer 320 of the OLED 300 may include a small molecular weight material or a polymer material. When the intermediate layer 320 includes a small molecular weight material, the intermediate layer 320 of the OLED 300 may have a structure in which a hole injection layer (HIL), a hole transport layer (HTL), an emission layer (EML), an electron transport layer (ETL) and an electron injection layer (EIL) are stacked in a single or composite structure. The intermediate layer 320 of the OLED 300 may include various organic materials including copper phthalocyanine (CuPc), N,N'-Di(naphthalene-1-yl)-N,N'-diphenyl-benzidine (NPB), and tris-8-hydroxyquinoline aluminum)(Alq3). These layers may be formed through a method such as vacuum deposition.

When the intermediate layer 320 includes a polymer material, the intermediate layer 320 may have a structure including mostly a HTL and an EML. In this case, the HTL may include poly-3,4-alkenedioxythiophene (PEDOT), and the EML may include a poly-phenylenevinylene (PPV)-based and polyfluorene-based polymer material. The intermediate layer 320 may be formed through screen printing, ink-jet printing or laser induced thermal imaging (LITI).

The intermediate layer 320 is not limited thereto and may have various structures. The intermediate layer 320 may include a single layer formed in a plurality of pixel electrodes 310 and may include a layer patterned to correspond to each of the plurality of pixel electrodes 310.

The opposite electrode 330 may be disposed in an upper portion of the display area DA so as to cover the display area DA, as shown in FIG. 10. For example, the opposite electrode 330 may be formed as a single body in a plurality of OLEDs and may correspond to the plurality of pixel electrodes 310.

Because the OLEDs may be easily damaged by moisture or oxygen from the outside, the encapsulation layer 400 may cover and protect the encapsulation layer 400. The encapsulation layer 400 may cover the display area DA and may extend to the outside of the display area DA. The encapsulation layer 400 may include a first inorganic encapsulation layer 410, an organic encapsulation layer 420, and a second inorganic encapsulation layer 430, as shown in FIG. 10.

The first inorganic encapsulation layer 410 may cover the opposite electrode 330 and may include silicon oxide, silicon nitride and/or silicon oxynitride. Of course, other layers including a capping layer may also be between the first inorganic encapsulation layer 410 and the opposite electrode 330 as occasions demand. The first inorganic encapsulation layer 410 is formed according to a structure thereunder, and a top surface of the first inorganic encapsulation layer 410 is not flat, as shown in FIG. 10.

The organic encapsulation layer 420 covers the first inorganic encapsulation layer 410, and a top surface of the organic encapsulation layer 420 may be approximately flat, unlike in the first inorganic encapsulation layer 410. In detail, the top surface of the organic encapsulation layer 420 in a portion corresponding to the display area DA may be approximately flat. The organic encapsulation layer 420 may include one or more materials selected from the group consisting of polyethylene terephthalate (PET), polyethylene naphthalate (PEN), polycarbonate (PC), polyimide, polyethylene sulfonate, polyoxymethylene, polyarylate, and hexamethyldisiloxane.

The second inorganic encapsulation layer 430 may cover the organic encapsulation layer 420 and may include silicon oxide, silicon nitride and/or silicon oxynitride. The second inorganic encapsulation layer 430 may be in contact with the first inorganic encapsulation layer 410 at edges outside the display area DA so that the organic encapsulation layer 420 may not be exposed to the outside.

The encapsulation layer 400 includes the first inorganic encapsulation layer 410, the organic encapsulation layer 420, and the second inorganic encapsulation layer 430. Thus, even when crack occurs in the encapsulation layer 400 through such a multi-layer structure, no crack may occur between the first inorganic encapsulation layer 410 and the organic encapsulation layer 420 or between the organic encapsulation layer 420 and the second inorganic encapsulation layer 430. Thus, a path in which moisture or oxygen from the outside penetrates into the display area DA, may be prevented from being formed or the formation of the path may be minimized.

In an example embodiment, a process of forming a touch electrode having various patterns for a touch screen function or a touch protection layer for protecting the touch electrode may be performed on the encapsulation layer 400.

A display panel includes a protection film 170 positioned on a bottom surface that is a surface in an opposite direction (a direction −D3) to a direction (a direction +D3) in which the display unit of the substrate 100 is positioned. The protection film 170 may be attached onto the bottom surface of the substrate 100 due to an adhesive layer 180.

The protection film 170 may include polyethyelene-terepthalate (PET). As described above, the protection film 170 may be attached onto the bottom surface of the substrate 100 due to the adhesive layer 180. The adhesive layer 180 may include a pressure sensitive adhesive (PSA), for example. A time when the protection film 170 is attached onto the bottom surface of the substrate 100, may vary according to circumstances.

A polarization plate 520 may be attached to the encapsulation layer 400 due to an optically clear adhesive (OCA) 510, and a printed circuit board (PCB)(not shown) or an electronic chip (not shown) may be attached in the second non-display area NDA2 as occasions demand. Of course, when a touch electrode or touch protection layer is positioned on the encapsulation layer 400, the OCA 510 and the polarization plate 520 are positioned on these components.

Also, a stress neutralization layer (SNL) 600 may be formed outside the display area DA as occasion demands. The SNL 600 may be formed of an organic material, for example.

The polarization plate 520 may reduce external light reflection. For example, when external light passes through the polarization plate 520, is reflected on a top surface of the opposite electrode 330 and passes through the polarization plate 520 again, the polarization plate 520 may change the phase of the external light as the external light passes through the polarization plate 520 twice. As a result, the phase of a reflected light may be different from the phase of the external light that enters into the polarization plate 520 so that destructive interference may occur. As a result, external light reflection may be reduced so that visibility may be increased. The OCA 510 and the polarization plate 520 may be positioned to cover the opening of the planarization layer 140, as shown in FIG. 10, for example.

Meanwhile, an opening OP may be positioned in the bending area BA of the non-display area NDA. The opening OP may be formed by removing a part of an inorganic insulating portion IL so that at least a part of the substrate 100 may be exposed. The inorganic insulating portion IL may include a buffer layer 110, a gate insulating layer 120, and a first interlayer insulating layer 130, for example, as shown in FIG. 10. In another embodiment, when the first interlayer insulating layer 130 includes an inorganic material, the inorganic insulating portion IL may include the buffer layer 110 and the gate insulating layer 120.

An organic insulating layer 160a may be filled in the opening OP. Because an inorganic layer is weak to stress compared to an organic layer, a part of the inorganic layer (i.e., the inorganic insulating portion IL) disposed in the bending area BA is removed to fill the opening OP with the organic insulating layer 160a so that stress in the bending area BA may be alleviated.

Referring to FIGS. 7 and 10 together, the (n-th)-first conductive lines CL1-n may include a first upper conductive layer 1-na positioned in the first non-display area NDA1, a first lower conductive layer 1-nc positioned in the second non-display area NDA2, and a first connection conductive layer 1-nb positioned in the bending area BA.

The first upper conductive layer 1-na and the first lower conductive layer 1-nc may be positioned on the same layer, and the first connection conductive layer 1-nb may be positioned on different layers from the first upper conductive layer 1-na and the first lower conductive layer 1-nc. For example, in FIG. 10, the first upper conductive layer 1-na and the first lower conductive layer 1-nc may be positioned on the gate insulating layer 120, and the first connection conductive layer 1-nb may be positioned on over the organic insulating layer 160a and the first interlayer insulating layer 130.

The first upper conductive layer 1-na and the first lower conductive layer 1-nc may include the same material as a material for forming the gate electrode 213 of the TFT 210, and the first connection conductive layer 1-nb may include the same material as a material for forming the source electrode 215a and the drain electrode 215b.

The first interlayer insulating layer 130 may be disposed between the first upper conductive layer 1-na, the first lower conductive layer 1-nc, and the first connection conductive layer 1-nb. The first upper conductive layer 1-na and the first connection conductive layer 1-nb may be electrically connected to one another via a contact hole CT defined by the first interlayer insulating layer 130. The first lower conductive layer 1-nc and the first connection conductive layer 1-nb may also be electrically connected to one another via another contact hole CT defined by the first interlayer insulating layer 130.

Figure 11:
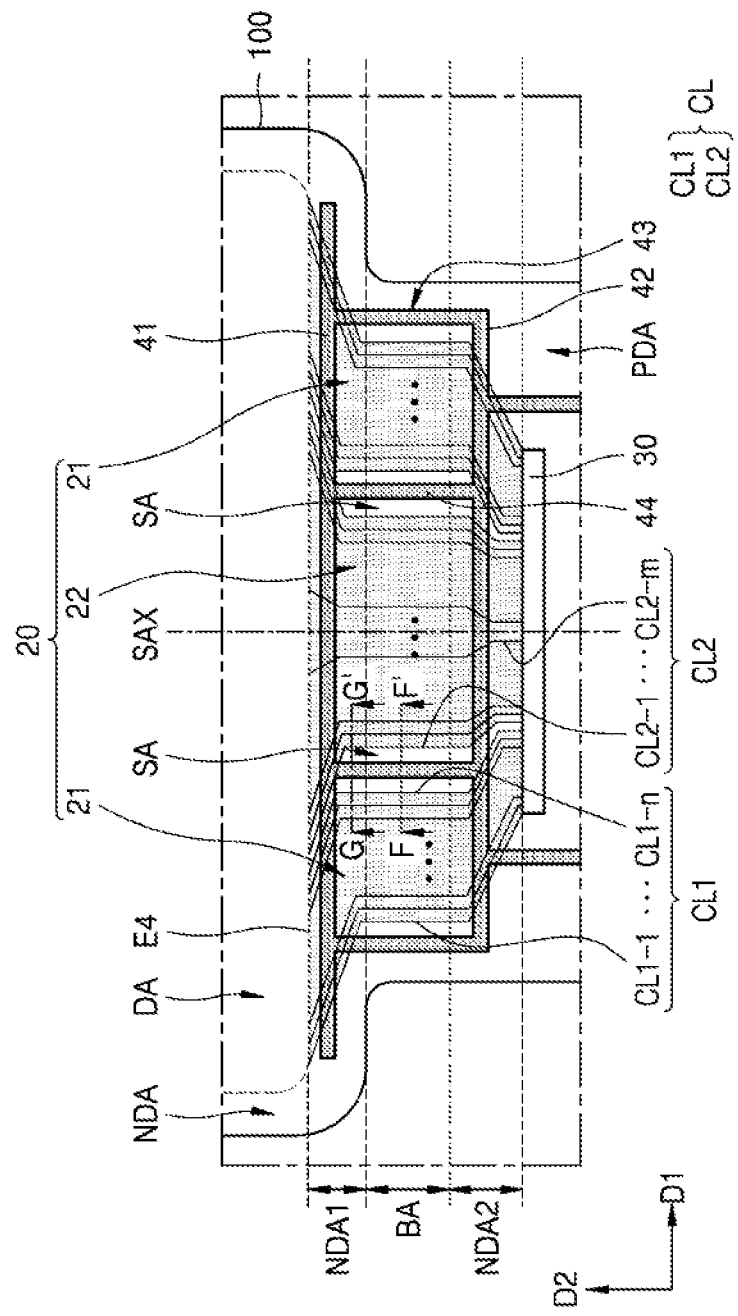
FIG. 11 is a plan view schematically illustrating a display apparatus according to another embodiment.
Figure 12:
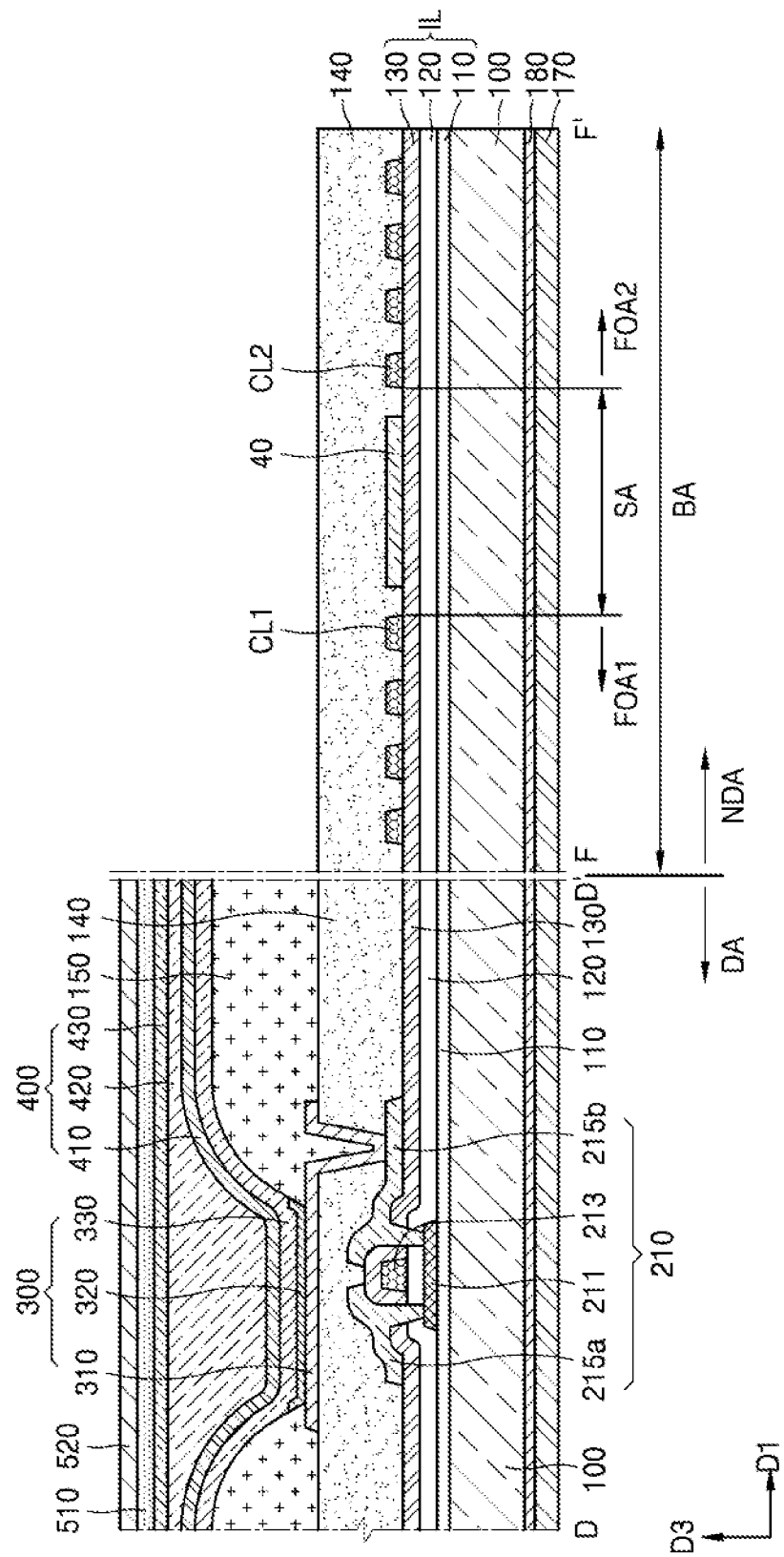
FIG. 12 is a cross-sectional view schematically illustrating a part of FIG. 11.

FIG. 11 is a plan view schematically illustrating a display apparatus according to an embodiment, and FIG. 12 is a cross-sectional view schematically illustrating a part of FIG. 11. The non-display area NDA of FIG. 12 corresponds to a cross-section taken along line F-F' of FIG. 11.

Referring to FIG. 11, a driving power supply line 40 may be positioned in the pad area PDA. At least a part of the driving power supply line 40 may overlap the fan-out portion 20.

The driving power supply line 40 may include a first conduction portion 41 and a second conduction portion 42 that extend in the first direction D1. The first conduction portion 41 may be positioned in the first non-display area NDA1, and the second conduction portion 42 may be positioned in the second non-display area NDA2.

The first conduction portion 41 and the second conduction portion 42 may be connected to one another by a first connection conduction portion 43 and a second connection conduction portion 44 that extend in the second direction D2. The first connection conduction portion 43 may extend to an outer edge of the fan-out portion 20.

For convenience of explanation, the driving power supply line 40 includes the first conduction portion 41, the second conduction portion 42, the first connection conduction portion 43, and the second connection conduction portion 44. However, the driving power supply line 40 may be a conductive layer formed as a single body by the same mask.

At least a part of the driving power supply line 40 may be positioned in the separation area SA. For example, the second connection conduction portion 44 is positioned in the separation area SA between the first fan-out portion 21 and the second fan-out portion 22.

The driving power supply line 40 may include the same material as a material for forming the source electrode 215a and the drain electrode 215b of the TFT 210, for example. The driving power supply line 40 of FIG. 11 may overlap the fan-out portion 20 in the first non-display area NDA1 and the second non-display area NDA2 without overlapping the fan-out portion 20 in the bending area BA. This is because, as shown in FIG. 10, a part of the fan-out portion 20 positioned in the first non-display area NDA1 and the second non-display area NDA2 and a part of the fan-out portion 20 positioned in the bending area BA are positioned in different layers.

FIGS. 13 and 14 are plan views schematically illustrating display apparatuses according to other embodiments.

The embodiments of FIGS. 13 and 14 are modified embodiments of FIG. 4, and the structure of the fan-out portion 20 according to the embodiment of FIGS. 13 and 14 is different from that according to the embodiment of FIG.

4. The remaining components are the same as those according to the embodiment of FIG. 4, Hereinafter, fan-out portions 20' and 20'' will be described.

Referring to FIG. 13, the display apparatus according to the present embodiment includes a fan-out portion 20' positioned over a first non-display area NDA1, a bending area BA, and a second non-display area NDA2. The fan-out portion 20' may include a first fan-out portion 21, a second fan-out portion 22, and a third fan-out portion 23, which are sequentially positioned from the outer edge of the fan-out portion 20'.

The third fan-out portion 23 may be positioned in the center, and the second fan-out portion 22 may be positioned between the third fan-out portion 23 and the first fan-out portion 21. The first fan-out portion 21 through the third fan-out portion 23 may be disposed symmetrically. The third fan-out portion 23 may be disposed symmetrically with respect to the symmetry axis SAX positioned in the third fan-out portion 23. The second fan-out portion 22 may be positioned on both sides of the third fan-out portion 23. A second separation area SA2 is disposed between the second fan-out portion 22 and the third fan-out portion 23. The first fan-out portion 21 may be positioned outside the second fan-out portion 22. A first separation area SA is disposed between the first fan-out portion 21 and the second fan-out portion 22. In an embodiment, the first fan-out portion 21 through the third fan-out portion 23 are distinguished from each other due to the first separation area SA1 and the second separation area SA2.

The first fan-out portion 21 through the third fan-out portion 23 may transmit a data signal applied from the driving circuit portion 30 positioned in the second non-display area NDA2 to the display unit 10.

Referring to FIG. 14, the display apparatus according to the present embodiment includes a fan-out portion 20'' positioned over a first non-display area NDA1, a bending area BA, and a second non-display area NDA2. The fan-out portion 20'' may include a first fan-out portion 20A and a second fan-out portion 20B. The first fan-out portion 20A and the second fan-out portion 20B may be connected to a first driving circuit portion 30A and a second driving circuit portion 30B, respectively.

Each of the first fan-out portion 20A and the second fan-out portion 20B may include the first fan-out portion 21 through the third fan-out portion 23 in a mirror-symmetric manner. In FIGS. 13 and 14, the display apparatus includes the first fan-out portion 21 through the third fan-out portion 23. However, a fan-out portion may be classified into four or more fan-out portions according to the size of the display apparatus and the area of the non-display area.

Because even in the display apparatuses of FIGS. 13 and 14, the separation area SA is between fan-out portions, widths of conductive lines of the first fan-out portion 21 through the third fan-out portion 23 placed in the second non-display area NDA are increased or decreased so that resistance of the fan-out portion (20 or 20A and 20B) may be gradually reduced or increased.

Figure 15:
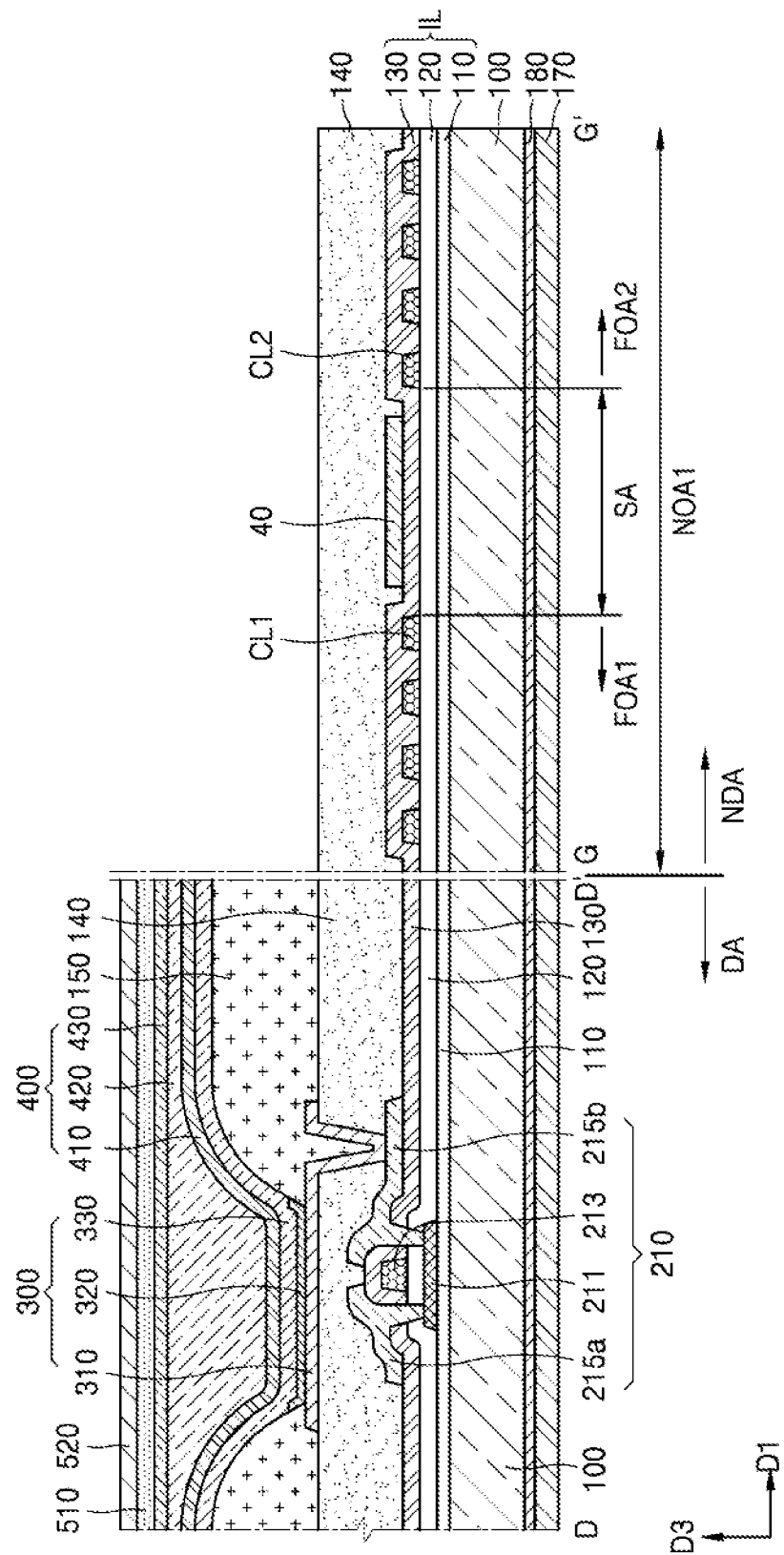
FIGS. 15 to 17 are cross-sectional views schematically illustrating a display apparatus according to another embodiment.

FIGS. 15 and 17 are cross-sectional views schematically illustrating a display apparatus according to another embodiment.

A non-display area NDA of FIG. 15 corresponds to a cross-section taken along line E-E' of FIG. 11. In FIG. 15, the cross-section of the first non-display area NDA1 of the non-display area NDA is shown. However, a cross-section of the second non-display area NDA2 is also similar to the first non-display area NDA1. Referring to FIG. 15, first conductive lines CL1 and second conductive lines CL2 positioned in the first non-display area NDA1 may be arranged on a different layer from a layer on which a driving power supply line 40 is positioned. In the first non-display area NDA1, the first conductive lines CL1 and the second conductive lines CL2 may be arranged in the same layer as a layer on which a gate electrode 213 of a TFT 210 is positioned, and the driving power supply line 40 may be disposed on the same layer as a layer on which a source electrode 215a and a drain electrode 215b of the TFT 210 are positioned.

In FIG. 15, the driving power supply line 40 and the first conductive lines CL1 (or the second conductive lines CL2) may not overlap each other. However, the driving power supply line 40 and the first conductive lines CL1 (or the second conductive lines CL2) may be positioned in different layers and thus may overlap each other.

In FIG. 17 that is a modified embodiment of FIG. 15, the TFT 210 compared to the above-described embodiments may have a different structure.

Referring to a display area DA of FIG. 17, the TFT 210 may include a first gate electrode 213a and a second gate electrode 213b. The first gate electrode 213a and the second gate electrode 213b may be stacked so that at least a part of the first gate electrode 213a and the second gate electrode 213b overlap each other so that the first gate electrode 213a and the second gate electrode 213b may function as a lower electrode and an upper electrode of a storage capacitor.

Referring to a non-display area NDA of FIG. 17, similarly to FIG. 7 described above, adjacent conductive lines may be alternately arranged in different layers. The first conductive lines CL1 adjacent to one another are arranged in a gate insulating layer 120 and a first interlayer insulating layer 130. The first conductive lines CL1 arranged in the gate insulating layer 120 may include the same material as a material for forming the first gate electrode 213a of the TFT 210, and the second conductive lines CL2 arranged in the first interlayer insulating layer 130 may include the same material as a material for forming the second gate electrode 213b of the TFT 210. The driving power supply line 40 may include the same material as a material for forming the source electrode 215a and the drain electrode 215b of the TFT 210.

Until now, the display apparatus has been described. However, embodiments are not limited thereto. For example, a method of manufacturing the display apparatus will also belong to the scope of the present disclosure.

As described above, according to embodiments, a display apparatus in which a non-emission area is reduced and luminous uniformity between adjacent pixels is improved, can be implemented. Of course, the scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate including a display area, a first non-display area adjacent to the display area, a second non-display area, and a bending area between the first non-display area and the second non-display area;

a display unit positioned in the display area;
a driving circuit positioned in the second non-display area; and
a fan-out portion positioned in the first non-display area, the bending area, and the second non-display area between the display unit and the driving circuit and configured to transmit a data signal applied from the driving circuit to the display unit,
wherein the fan-out portion comprises a first fan-out portion including a plurality of first conductive lines adjacent to one another, a second fan-out portion including a plurality of second conductive lines adjacent to one another, and a separation area between the first fan-out portion and the second fan-out portion,
wherein the first fan-out portion and the second fan-out portion are separated from each other by a predetermined distance in the bending area,
wherein a first width of one of the plurality of first conductive lines, which is closest to the separation area among the plurality of first conductive lines, and a second width of one of the plurality of second conductive lines, which is closest to the separation area among the plurality of second conductive lines, are the same as each other in the first non-display area and are different from each other in the second non-display area.

2. The display apparatus of claim 1,
wherein a driving power supply line is positioned in the separation area.

3. The display apparatus of claim 1,
wherein the bending area is bent based on a bending axis that extends in a first direction, and
wherein the plurality of first conductive lines and the plurality of second conductive lines in the bending area are extended in a second direction that is perpendicular to the bending axis.

4. The display apparatus of claim 1,
wherein the plurality of first conductive lines in the bending area are positioned on at least two different insulating layers, and
wherein the plurality of first conductive lines and the plurality of second conductive lines in the first non-display area and the second non-display area are positioned on at least two different insulating layers.

5. The display apparatus of claim 1,
wherein the plurality of first conductive lines and the plurality of second conductive lines include data lines.

6. The display apparatus of claim 1,
wherein the bending area is bent with respect to a bending axis that extends in a first direction, and
a width of the first non-display area in a second direction perpendicular to the first direction is less than a width of the second non-display area in the second direction.

7. The display apparatus of claim 1,
wherein each of the plurality of first conductive lines is extended in a lengthwise direction with at least two or more turning regions.

8. The display apparatus of claim 7,
wherein the plurality of first conductive lines and the plurality of second conductive lines are extended through the bending area in parallel without having at least one turning region.

9. The display apparatus of claim 1,
wherein the plurality of first conductive lines comprise n first conductive lines including a first-first conductive line through an (n-th)-first conductive line sequentially arranged, and the plurality of second conductive lines comprise m second conductive lines including a first-second conductive line through an (m-th)-second conductive line sequentially arranged, and
a length of each of the plurality of first conductive lines is decreased in an order from the first-first conductive line to the (n-th)-first conductive line, and
a length of each of the plurality of second conductive lines is decreased in an order from the first-second conductive line to the (m-th)-second conductive line.

10. The display apparatus of claim 9,
wherein the (n-th)-first conductive line and the first-second conductive line are closest to each other,
wherein the separation area is disposed between the (n-th)-first conductive line and the first-second conductive line, and
wherein a length of the first-second conductive line is greater than a length of the (n-th)-first conductive line.

11. The display apparatus of claim 9,
wherein resistance values of the plurality of first conductive lines and the plurality of second conductive lines are gradually decreased in an order from the first-first conductive line to the first-second conductive line.

12. The display apparatus of claim 9,
wherein the (n-th)-first conductive line and the first-second conductive line are closest to each other,
wherein the separation area is disposed between the (n-th)-first conductive line and the first-second conductive line, and
wherein a resistance value of the first-second conductive line is less than a resistance value of the (n-th)-first conductive line.

13. The display apparatus of claim 1,
wherein the display unit comprises a thin-film transistor and a light-emitting device electrically connected to the thin-film transistor, and
the thin-film transistor comprises a semiconductor layer, a gate electrode, and an electrode layer connected to the semiconductor layer, and
a portion of the fan-out portion in the bending area includes a same material as a material for the electrode layer, and a portion of the fan-out portion in the first non-display area and the second non-display area includes a same material as a material for the gate electrode.

14. The display apparatus of claim 13,
wherein at least one of the plurality of first conductive lines comprise a first upper conductive layer positioned in the first non-display area, a first lower conductive layer positioned in the second non-display area, and a first connection conductive layer positioned in the bending area, and
at least one the plurality of second conductive lines comprise a second upper conductive layer positioned in the first non-display area, a second lower conductive layer positioned in the second non-display area, and a second connection conductive layer positioned in the bending area, and
a width of the second lower conductive layer is greater than a width of the first lower conductive layer.

15. The display apparatus of claim 1, further comprising:
an inorganic insulating portion positioned on the substrate, wherein the inorganic insulating portion comprises an opening in the bending area.

16. The display apparatus of claim 15, further comprising:
an organic insulating layer positioned in the opening of the inorganic insulating portion.

17. The display apparatus of claim 16,
wherein a portion of the fan-out portion is positioned on the organic insulating layer in the bending area.

18. The display apparatus of claim 1,
wherein the display unit comprises a thin-film transistor and a light-emitting device electrically connected to the thin-film transistor, and
the thin-film transistor comprises a semiconductor layer, a first gate electrode, a second gate electrode of which at least part overlaps the first gate electrode, and an electrode layer connected to the semiconductor layer.

19. The display apparatus of claim 18,
wherein the plurality of first conductive lines are arranged spaced apart from each other and alternately arranged on two different layers.

20. The display apparatus of claim 19,
wherein the plurality of first conductive lines in the first non-display area and the second non-display area comprise a same material as a material of the first gate electrode or a same material as a material of the second gate electrode.

21. A display apparatus comprising:
a substrate including a display area, a first non-display area adjacent to the
display area, a second non-display area, and a bending area between the first non-display area and the second non-display area;
a fan-out portion positioned in the first non-display area, the bending area, and the second non-display area and comprising a plurality of conductive lines continuously arranged in the bending area, wherein the plurality of conductive lines include a plurality of first conductive lines and a plurality of second conductive lines; and
a separation area disposed between the plurality of first conductive lines and the plurality of second conductive lines,
wherein resistance values of the plurality of conductive lines are gradually decreased from an outer edge to a center thereof, and
wherein at least one of the plurality of first conductive lines and at least one of the plurality of second conductive lines have different widths in the second non-display area.

22. A display apparatus comprising:
a substrate including a display area, a first non-display area adjacent to the display area, a second non-display area, and a bending area between the first non-display area and the second non-display area;
a display unit on the substrate;
a driving circuit; and
a fan-out portion positioned between the driving circuit and the display unit,
wherein the fan-out portion includes a plurality of conductive lines each of which extends through the bending area from the driving circuit to the display unit with at least two turning regions at which an extending direction changes, and
wherein the plurality of conductive lines include a plurality of first conductive lines arranged spaced apart from each other at a first spacing in the bending area,
wherein the plurality of conductive lines are separated from the plurality of first conductive lines by a separation region and further include a plurality of second conductive lines arranged spaced apart from each other at a second spacing in the bending area,
wherein one of the plurality of first conductive lines and one of the plurality of second conductive lines are spaced apart from each other at a third spacing greater than each of the first spacing and the second spacing,
wherein a first width of one of the plurality of first conductive lines, which is closest to the separation area among the plurality of first conductive lines, and a second width of one of the plurality of second conductive lines, which is closest to the separation area among the plurality of second conductive lines, are the same as each other in the first non-display area and are different from each other in the second non-display area.

23. The display apparatus of claim 22,
wherein the plurality of second conductive lines are positioned closer to a center of the bending area, and
wherein each of the plurality of second conductive lines has an enlarged portion in the bending area.

24. The display apparatus of claim 23,
wherein the first spacing and the second spacing are the same.

25. The display apparatus of claim 23,
where the third spacing is at least two times the first spacing,
wherein the separation area is disposed between the (n-th)-first conductive line and the first-second conductive line, and
wherein a length of the first-second conductive line is greater than a length of the (n-th)-first conductive line.

* * * * *